United States Patent
Wilson et al.

(10) Patent No.: US 7,017,655 B2
(45) Date of Patent: Mar. 28, 2006

(54) FORCED FLUID HEAT SINK

(75) Inventors: Michael J. Wilson, Racine, WI (US);
Kevin L. Wert, Halifax, PA (US);
Jonathan Wattelet, Gurnee, IL (US);
Richard DeKeuster, Racine, WI (US);
Donald Lightner, Franksville, WI (US)

(73) Assignee: Modine Manufacturing Co., Racine, WI (US)

( * ) Notice: Subject to any disclaimer, the term of this patent is extended or adjusted under 35 U.S.C. 154(b) by 0 days.

(21) Appl. No.: 10/739,759

(22) Filed: Dec. 18, 2003

(65) Prior Publication Data
US 2005/0133212 A1    Jun. 23, 2005

(51) Int. Cl.
*H05K 7/20* (2006.01)
*F28F 3/12* (2006.01)

(52) U.S. Cl. ............... 165/80.4; 165/168; 165/104.33; 361/699

(58) Field of Classification Search ............... 165/80.4, 165/104.33, 168, 170; 361/699, 700
See application file for complete search history.

(56) References Cited

U.S. PATENT DOCUMENTS

| | | |
|---|---|---|
| 1,601,637 A | 9/1926 | Meigs |
| 2,019,351 A | 10/1935 | Lathrop |
| 2,656,159 A | 10/1953 | Holm et al. |
| 2,875,986 A | 3/1959 | Holm |
| 2,905,742 A | 9/1959 | Woods |
| 3,212,864 A | 10/1965 | Rhudy |
| 3,282,011 A | 11/1966 | Meserole et al. |
| 3,282,334 A | 11/1966 | Stahlheber |
| 3,380,517 A | 4/1968 | Butt |
| 3,393,117 A | 7/1968 | Zolg et al. |
| 3,404,446 A | 10/1968 | Kritzer |
| 3,734,177 A | 5/1973 | Bellovary et al. |
| 3,817,321 A * | 6/1974 | Von Cube et al. ...... 165/104.22 |
| 3,829,945 A | 8/1974 | Kanzler et al. |
| 3,934,618 A | 1/1976 | Henderson |

(Continued)

FOREIGN PATENT DOCUMENTS

CA    1026013    2/1978

(Continued)

OTHER PUBLICATIONS

IBM Technical Disclosure Bulletin, Cooling Fin Structure; Biskeborn et al.; vol. 25, No. 2, Jul. 1982; pp618-619.

(Continued)

*Primary Examiner*—Allen J. Flanigan
(74) *Attorney, Agent, or Firm*—Duane Morris LLP

(57) ABSTRACT

A heat exchanger for cooling a heat generating device is provided that includes a plurality of plates each defining at least one through-bore. The plates are laminated together to form a stack so that a plurality of enclosed chambers are formed by an alignment of a first portion of the through-bores within the block, and a plurality of passageways are formed by an alignment of a second portion of the through-bores within the stack such that at least one of the passageways is arranged in fluid communication with at least two of the chambers. A baffle-plate is disposed within a portion of the stack so as to form a chamber boundary and thereby to define a circuitous fluid flow path between the chambers through the at least one passageway. A fluid entrance port is defined in a first outer one of the plates and arranged in fluid communication with one of the chambers, and a fluid exit port is also defined in a second outer one of the plates and arranged in fluid communication with another one of the chambers.

4 Claims, 16 Drawing Sheets

U.S. PATENT DOCUMENTS

| | | | |
|---|---|---|---|
| 3,993,125 A | 11/1976 | Rhodes | |
| 4,023,616 A | 5/1977 | Scherbaum | |
| 4,099,928 A | 7/1978 | Norback | |
| 4,387,703 A | 6/1983 | Poole | |
| 4,428,418 A | 1/1984 | Beasley et al. | |
| 4,593,446 A | 6/1986 | Hayner | |
| 4,615,383 A | 10/1986 | Hisao | |
| 4,616,695 A | 10/1986 | Takahashi et al. | |
| 4,624,305 A | 11/1986 | Rojey | |
| 4,807,342 A | 2/1989 | Lapeyre | |
| 4,830,678 A | 5/1989 | Todorof et al. | |
| 4,898,234 A | 2/1990 | McGovern et al. | |
| 4,970,579 A | 11/1990 | Arldt et al. | |
| 5,070,936 A | 12/1991 | Carroll et al. | |
| 5,125,451 A | 6/1992 | Matthews | |
| 5,159,529 A | 10/1992 | Lovgren et al. | |
| 5,175,613 A | 12/1992 | Barker, III et al. | |
| 5,180,001 A | 1/1993 | Okada et al. | |
| 5,201,866 A | 4/1993 | Mok | |
| 5,205,353 A | 4/1993 | Willemsen et al. | |
| 5,232,047 A * | 8/1993 | Matthews | 165/168 |
| 5,241,131 A | 8/1993 | Bakhru et al. | |
| 5,304,846 A | 4/1994 | Azar et al. | |
| 5,324,452 A | 6/1994 | Allam et al. | |
| 5,329,996 A | 7/1994 | Rosenfeld | |
| 5,335,414 A | 8/1994 | Joyce et al. | |
| 5,473,118 A | 12/1995 | Fukutake et al. | |
| 5,473,508 A | 12/1995 | Porter et al. | |
| 5,494,100 A | 2/1996 | Peze | |
| 5,584,341 A | 12/1996 | Sabin et al. | |
| 5,660,049 A | 8/1997 | Erickson | |
| 5,666,269 A | 9/1997 | Romero et al. | |
| 5,698,899 A | 12/1997 | Hirakawa et al. | |
| 5,701,760 A * | 12/1997 | Torigoe et al. | 62/524 |
| 5,793,118 A | 8/1998 | Nakajima | |
| 5,821,612 A | 10/1998 | Kitagawa | |
| 5,823,253 A | 10/1998 | Kontu | |
| 5,829,516 A | 11/1998 | Lavochkin | |
| 5,841,634 A | 11/1998 | Visser | |
| 5,863,185 A | 1/1999 | Cochimin et al. | |
| 5,915,463 A | 6/1999 | Romero et al. | |
| 5,978,220 A | 11/1999 | Frey et al. | |
| 6,059,023 A | 5/2000 | Kurematsu | |
| 6,098,706 A | 8/2000 | Urch | |
| 6,102,994 A | 8/2000 | Zhou et al. | |
| 6,108,164 A | 8/2000 | Weber, Jr. | |
| 6,119,766 A | 9/2000 | Blomgren | |
| 6,131,649 A | 10/2000 | Pearl et al. | |
| 6,154,366 A | 11/2000 | Ma et al. | |
| 6,292,365 B1 | 9/2001 | Ashiwake et al. | |
| 6,305,463 B1 * | 10/2001 | Salmonson | 165/80.3 |
| 6,367,543 B1 | 4/2002 | Calaman et al. | |
| 6,367,544 B1 | 4/2002 | Calaman | |
| 6,397,932 B1 | 6/2002 | Calaman et al. | |
| 6,422,307 B1 | 7/2002 | Bhatti et al. | |
| 6,508,301 B1 | 1/2003 | Marsala | |
| 6,546,774 B1 | 4/2003 | Granetzke | |
| 6,563,709 B1 * | 5/2003 | Negishi et al. | 361/699 |
| 6,578,626 B1 | 6/2003 | Calaman et al. | |
| 6,634,421 B1 | 10/2003 | Ognibene et al. | |

FOREIGN PATENT DOCUMENTS

| | | |
|---|---|---|
| DE | 25 31 450 A1 | 1/1977 |
| GB | 604464 | 7/1948 |
| GB | 1 334 173 | 10/1973 |
| GB | 2 270 862 A | 3/1994 |
| JP | 57049793 A | 3/1982 |
| JP | 58182091 A | 10/1983 |
| JP | 63290394 A | 11/1988 |
| JP | 01310239 A * | 12/1989 |
| JP | 4-234153 | 8/1992 |
| JP | 05164494 A | 6/1993 |
| JP | 6-74675 | 3/1994 |
| JP | 06094386 A * | 4/1994 |
| JP | 07038025 A * | 2/1995 |
| RU | 1161810 A | 6/1985 |
| WO | WO 98/44554 | 10/1998 |

OTHER PUBLICATIONS

Internet page of hardocp.com; Corsair Hydrocool 200; Mar. 9, 2004.

* cited by examiner

FORCED FLUID HEAT SINK

FIELD OF THE INVENTION

The present invention generally relates to heat exchanging devices and more particularly, to devices adapted for removing heat from electronic circuits, systems, and the like.

BACKGROUND OF THE INVENTION

It has been suggested that a computer is a thermodynamic engine that sucks entropy out of data, turns that entropy into heat, and dumps the heat into the environment. The ability of prior art thermal management technology to get that waste heat out of semiconductor circuits and into the environment, at a reasonable cost, has limited the density and clock speeds of electronic systems.

A typical characteristic of heat transfer devices for electronic systems is that the atmosphere is the final heat sink. In heat transfer devices for electronics today, a semiconductor chip is often arranged so as to thermally contact a passive heat spreader plate, which conducts the heat from the chip to one of several types of fins. The fins, in turn, convect heat to the atmosphere with natural or forced air convection. As the power to be dissipated by semiconductor devices increases with time, a problem arises in that the thermal conductivity of the available materials becomes too low to conduct the heat from the semiconductor devices to fins with an acceptable temperature drop. The thermal power density emerging from semiconductor devices today is so high that even solid copper or silver spreader plates are not adequate.

Thermal energy can sometimes be transported by an intermediate loop of recirculating fluid. Heat from a hot object is conducted into a heat transfer fluid, the fluid is pumped by some means to a different location, where the heat is conducted out of the fluid into a convective fin and finally into the atmosphere. For example, U.S. Pat. Nos. 5,125,451 and 5,274,920, issued to Matthews, provide a microscopic laminar-flow heat exchanger for cooling a heat generating device, such as a semiconductor integrated circuit. The heat exchanger consists of a plurality of thin plates which have been laminated together to form a block. The plates consist of thin copper foil strips each having a microscopic recessed portion etched into one face of the plate. These recessed portions are chemically etched to a shallow dimension, on the order of fifty microns deep, prior to lamination. Either before or after the plates are laminated together, holes are cut through the plates at opposite sides of the recessed portions such that when the stack is laminated the holes align to form a pair of coolant distribution manifolds. Each of the manifolds is essentially a tube which penetrates into the block. The tubes are connected via the plurality of microscopic channels formed from the recessed portions during the lamination process. Selectively adjusting the thickness of the channels and the coolant flow rate allows the block to function as a heat exchanger. A semiconductor die is simply placed or bonded onto the surface of the block to effectuate heat removal.

A significant disadvantage with structures such as are taught by Matthews is the limited surface area available for coolant contact and conductive heat transfer. Additional available surface area or a more serpentine coolant flow path, if provided, would greatly enhance the heat transfer characteristics of such devices. Unfortunately, the microscopic size of Matthew's devices, and the etching techniques used to manufacture such devices, do not provide for any meaningful increase in internal surface area or complex coolant flow paths, thereby limiting the amount of thermal energy that can be removed by a single device. Furthermore, such structures do not lend themselves easily to the use of internal structures for the creation of turbulence in the coolant as it flows through the device.

Although the creation of turbulence in coolant as it flows through a thermal transfer device is a well known technique for improving heat transfer, others have found that improved thermal performance can be achieved by configuring a fluid cooling device to support laminar fluid flow. For example, in U.S. Pat. No. 6,634,421, issued to Ognibene et al., a fluid cooling device is disclosed that includes a plurality of cold plate members, each having a plurality of imperforate plate portions and perforate portions arranged in a line with at least one connector for connecting the plate portions together at one end. The cold plate members are arranged in a stack, with respective plate portions of each cold plate member being in registration with perforate portions formed in its adjacent cold plate members in the stack. The fluid cooling device appears to provide heat transfer by close clearance laminar developing flow, which may increase the thermal performance of the fluid cooling device while maintaining low pressure drop.

None of the prior art has proved to be universally appropriate for achieving efficient thermal transfer in electronics systems.

SUMMARY OF THE INVENTION

The present invention provides a heat exchanger for cooling a heat generating device including a plurality of plates each defining at least one through-bore. The plates are laminated together to form a stack wherein (i) a plurality of enclosed chambers are formed by an alignment of a first portion of the through-bores within the block, and (ii) a plurality of passageways are formed by an alignment of a second portion of the through-bores within the stack such that at least one of the passageways is arranged in fluid communication between at least two of the chambers. Means for defining a circuitous coolant fluid flow path, such as a baffle-plate, are disposed within a portion of the stack so as to form a chamber boundary and thereby to define the circuitous coolant fluid flow path between the chambers through the at least one passageway. Means for fluid to enter the stack are often defined in a first outer one of the plates and arranged in fluid communication with one of the chambers, and means for fluid to exit the stack are also defined in a second outer one of the plates and arranged in fluid communication with another one of the chambers.

In one embodiment of the invention, a heat exchanger for cooling a heat generating device includes a plurality of spacer-plates where each defines a first through-bore and a second through-bore that are arranged in spaced-apart relation to one another. A plurality of channel-plates is also provided where each defines a central opening so that the plurality of spacer-plates and the plurality of channel-plates may be laminated together to form a stack in which a plurality of enclosed chambers are formed by an alignment of the central opening and adjacent ones of the first through-bores and another plurality of enclosed chambers are formed by an alignment of adjacent ones of the second through-bores within the stack. A plurality of passageways are formed by the intersection of the central through-bores with the chambers within the stack such that at least one of the passageways is arranged in fluid communication with at least two of the chambers. A baffle-plate defining a baffle through-bore adjacent to a lateral edge is disposed within a portion of the stack so as to form a chamber boundary that is spaced-away from the lateral edge thereby to define a circuitous fluid flow path between the chambers through selected ones of the passageways.

In another embodiment of the invention, a heat exchanger for cooling a heat generating device includes a plurality of plates that each define at least one through-bore. The plates are laminated together to form a stack so that a plurality of enclosed chambers are formed by an alignment of a first portion of the through-bores within the stack, and a plurality of passageways are formed by an alignment of a second portion of the through-bores within the stack. At least one of the passageways is arranged in fluid communication with at least two of the chambers. A baffle-plate defining a baffle through-bore adjacent to a lateral edge is disposed within a portion of the stack so as to form a chamber boundary that is spaced-away from the lateral edge thereby to define a circuitous fluid flow path between the chambers through the passageways. At least one fin core is positioned within the at least one passageway so as to enhance thermal conduction between the structures and a coolant fluid that is caused to flow through the stack.

In a further embodiment of the invention, a heat exchanger for cooling a heat generating device includes a plurality of plates, where each plate defines at least one through-bore. The plates are laminated together to form a stack so that a plurality of enclosed chambers are formed by an alignment of a first portion of the through-bores within the stack, and a plurality of passageways are formed by an alignment of a second portion of the through-bores within the stack. At least one of the passageways is arranged in fluid communication with at least two of the chambers. At least two baffle-plates are disposed in spaced-apart relation to one another within the stack. Each baffle-plate defines a baffle through-bore adjacent to a lateral edge. The baffle-plates are arranged in the stack so as to form at least two chamber boundaries that are each spaced-away from a lateral edge, thereby to define a circuitous fluid flow path between the chambers through the passageways. A fluid entrance port defined in a first outer one of the plates and arranged in fluid communication with one of the chambers and a fluid exit port defined in a second outer one of the plates and arranged in fluid communication with another one of the chambers.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENTS

Figure 1:
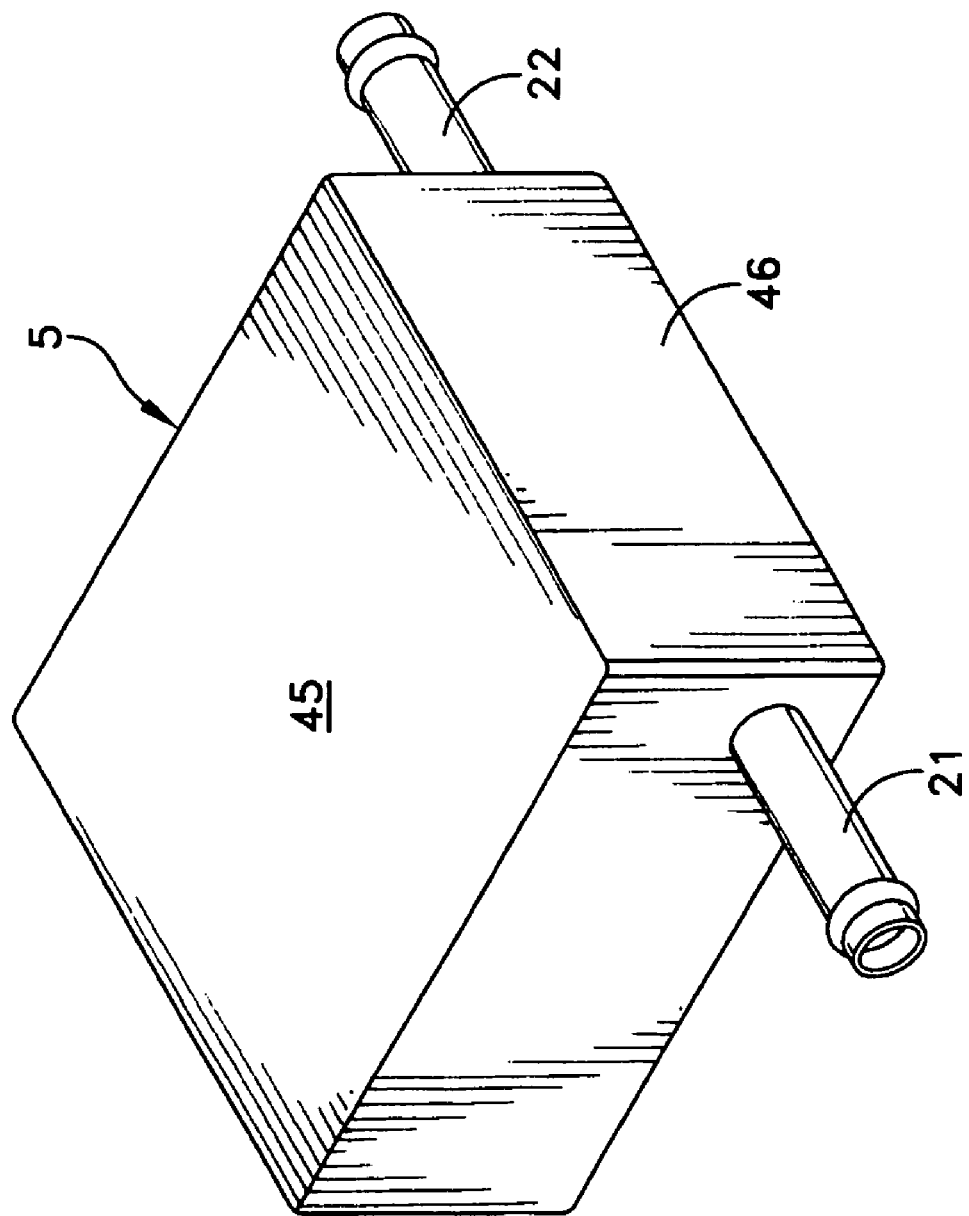
FIG. 1 is a perspective view of a forced fluid heat sink formed in accordance with the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figure 2:
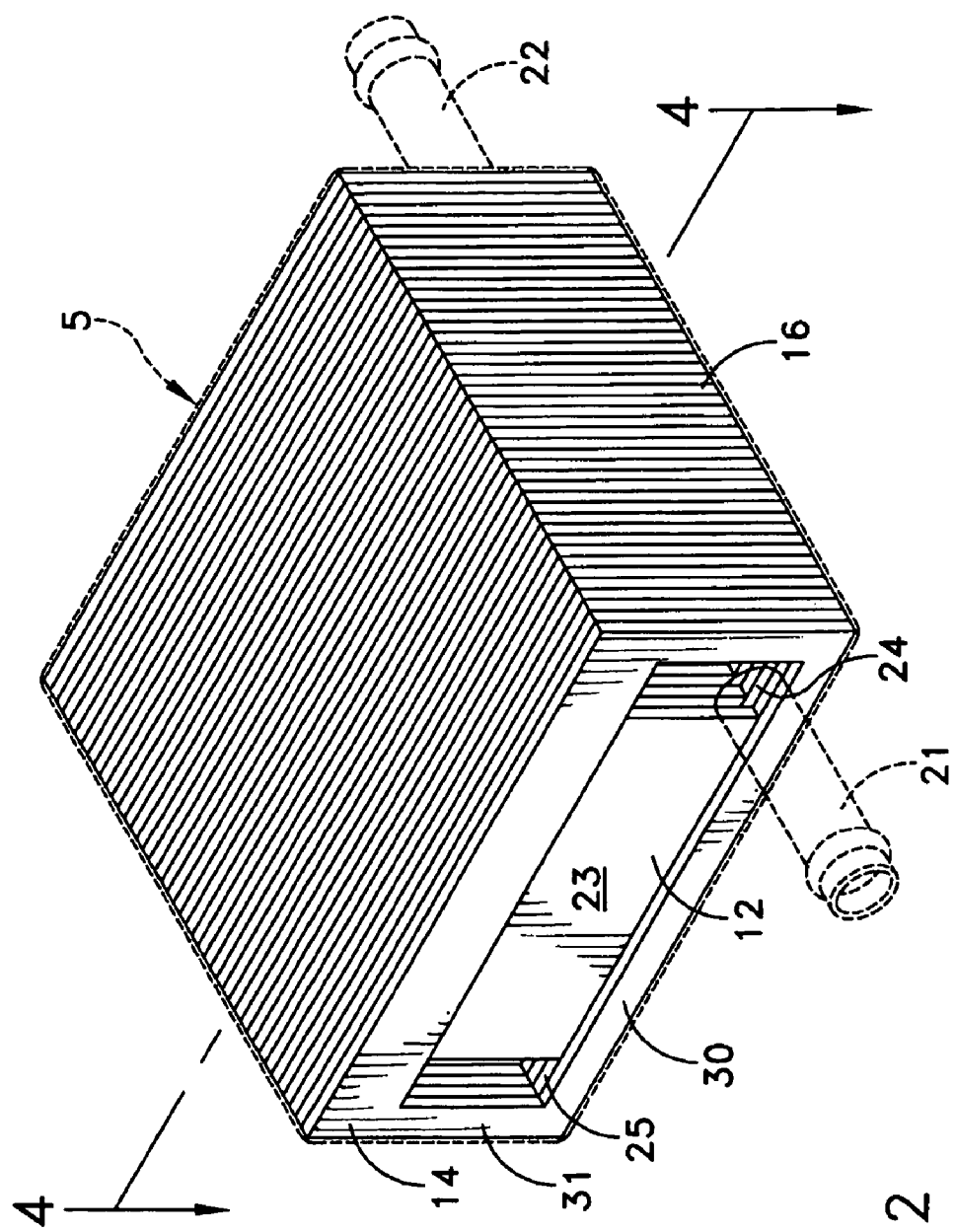
FIG. 2 is a perspective view, partially in phantom, of a stack of spacer-plates, channel-plates, and baffle-plates arranged in accordance with the present invention.

Referring to FIGS. 1–5, a forced fluid heat sink 5 formed in accordance with one embodiment of the invention comprises a first end-plate 8, a second end-plate 10, a plurality of spacer-plates 12, a plurality of channel-plates 14, and one or more baffle-plates 16, that are all stacked or laminated together to form a monolithic block (FIG. 2). More particularly, first end-plate 8, second end-plate 10, plurality of spacer-plates 12, plurality of channel-plates 14 and baffle-plates 16 each comprise a planar, polygonal sheet of thermally conductive material, e.g., stainless steel, copper or its alloys, or aluminum or its alloys, and are substantially the same size and shape. Often, all of these plates comprise a rectangular profile.

Figure 14:
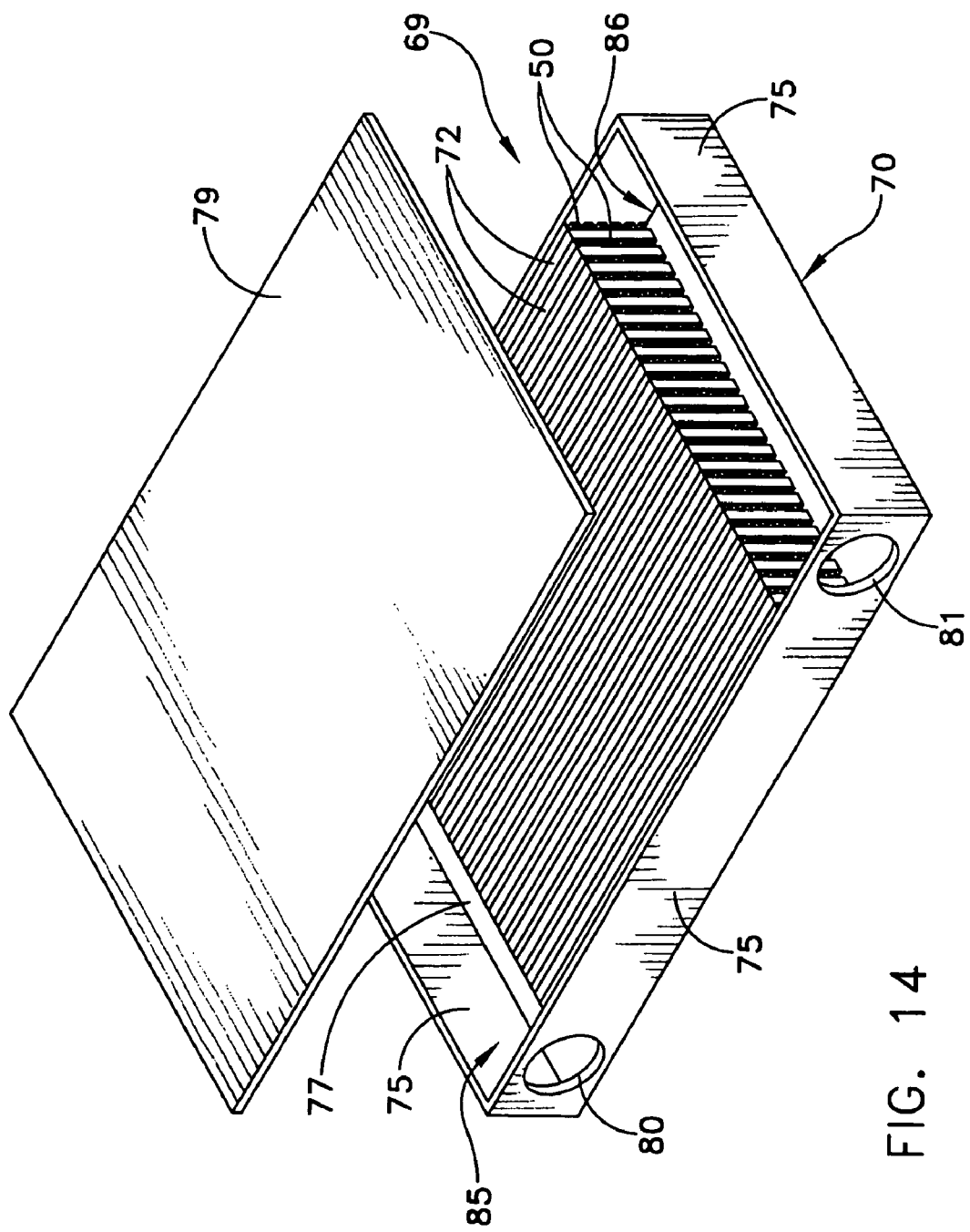
FIG. 14 is a partially exploded, perspective view of a forced fluid heat sink formed in accordance with another embodiment of the present invention.

First end-plate 8 and second end-plate 10 define at least one through-bore 19, that is sized and shaped so as to accept a nozzle port 21,22, respectively. It will be understood that nozzle ports 21,22 may also be located elsewhere on forced fluid heat sink 5, e.g., in a top surface or side surface of the monolithic block (FIG. 2) or as is shown in FIG. 14. Each spacer-plate 12 defines a central thermally conductive surface 23, with a pair of spaced-apart through-bores 24,25 located adjacent to the lateral edges of surface 23. The interior edge portions of spacer-plate 12, that define through-bores 24,25, may have a variety of shapes, e.g., rectangular, oval, or polygonal, and may or may not be of the same general size and shape. Thus, through-bores 24,25 may comprise a variety of shapes and sizes, and need not be matched in either size or shape, e.g., one through-bore may be larger than the other and differently shaped. By varying the shapes of through-bores 24,25, it is possible to cause turbulence in the form of eddies in the flowing coolant (FIGS. 4A and 4B). Each channel-plate 14 comprises a broad central opening 28 that is framed by a pair of spaced-apart, longitudinally extending beams 30 and a pair of spaced-apart, transversely extending beams 31. Broad central opening 28 of each channel-plate 14 is often significantly larger than through-bores 24,25 of spacer-plates 12. One or more baffle-plates 16 are provided having a single through-bore 35 defined adjacent to one lateral edge 36.

A forced fluid heat sink 5 formed in accordance with one embodiment of the invention is assembled in the following manner. A plurality of spacer-plates 12 and channel-plates 14 are arranged such that one spacer-plate 12 is positioned between each adjacent pair of channel-plates 14. In this way, a stack of spacer-plates 12 and channel-plates 14 are arranged between first end-plate 8 and second end-plate 10 (FIGS. 2, 3, 4, 7 and 8). As a result of this arrangement, a plurality of through-bores 24 are arranged in a coaxially aligned relation to one another, and spaced-apart by the thickness of each intervening channel-plate 14. Likewise, a plurality of through-bores 25 are also arranged in coaxially aligned relation to one another, and spaced-apart by the thickness of each intervening channel-plate 14. Together, aligned through-bores 24,25 and central openings 28 form two or more chambers 41(a–e) within the stack of plates, and a plurality of transverse passageways 39. This stacked structure is then laminated together, e.g., by soldering, brazing, welding, and in some variations of the invention, by adhesives, so as to form a sealed laminated or stacked structure.

Figure 3:
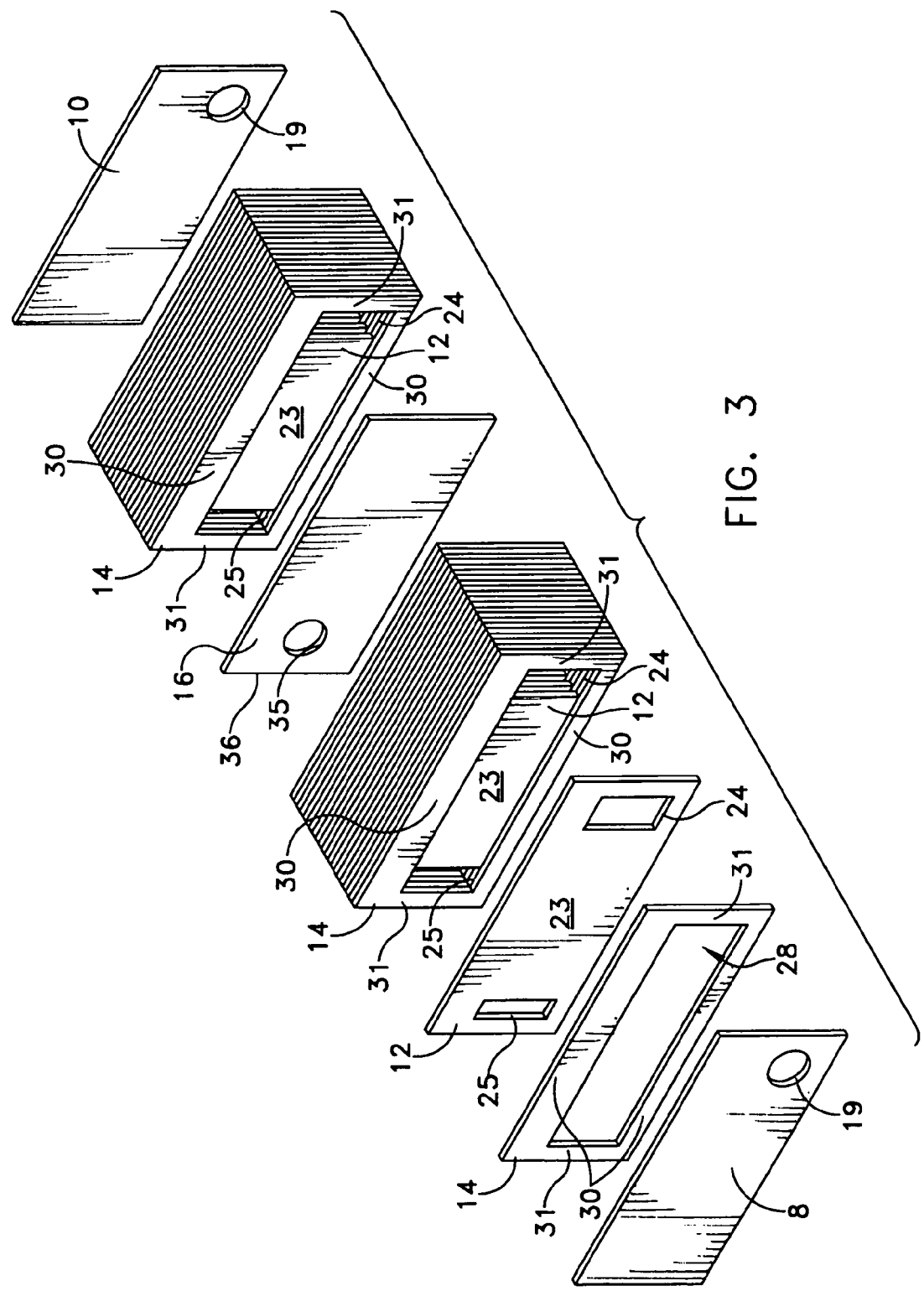
FIG. 3 is a perspective exploded view of the stack of plates shown in FIG. 2.
Figure 4:
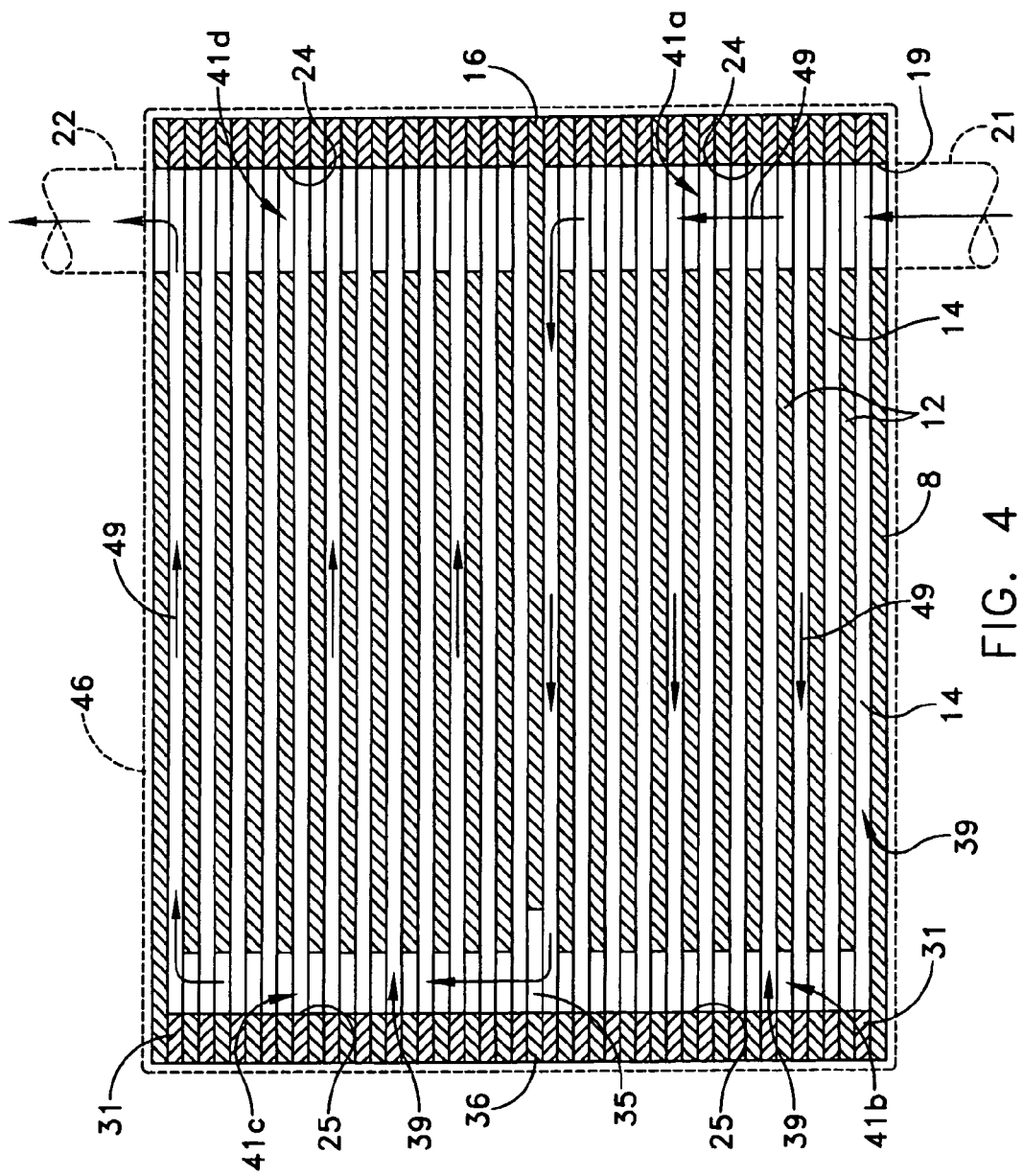
FIG. 4 is a cross-sectional top view of the forced fluid heat sink shown in FIGS. 1–3 and as taken along lines 4—4 in FIG. 2, illustrating one possible circuitous fluid flow arrangement.
Figure 4A:
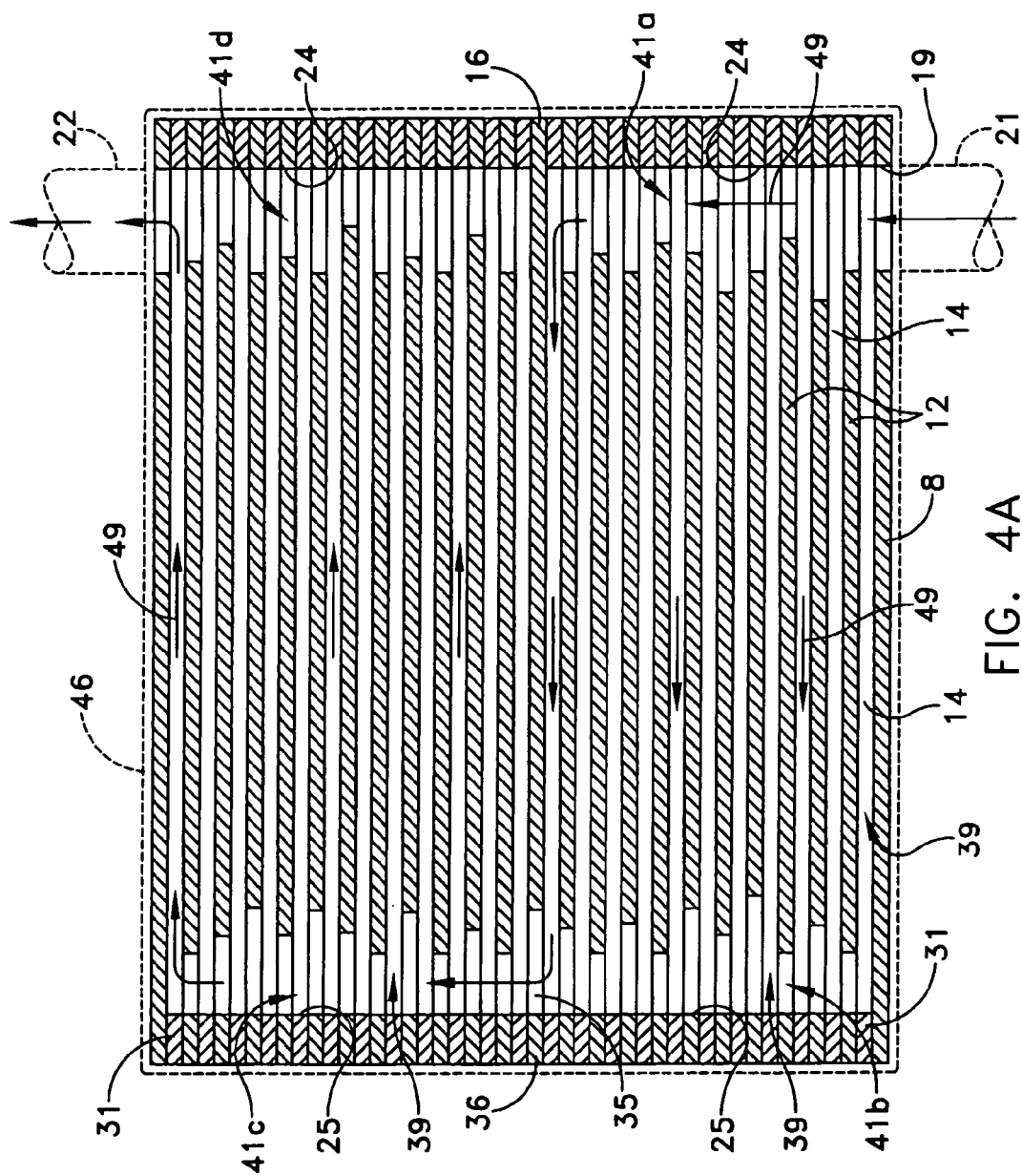
FIG. 4A is a cross-sectional top view, similar to that shown in FIG. 4, illustrating a plurality of spacer-plates having varying shapes and sizes of first and second through-bores.
Figure 4B:
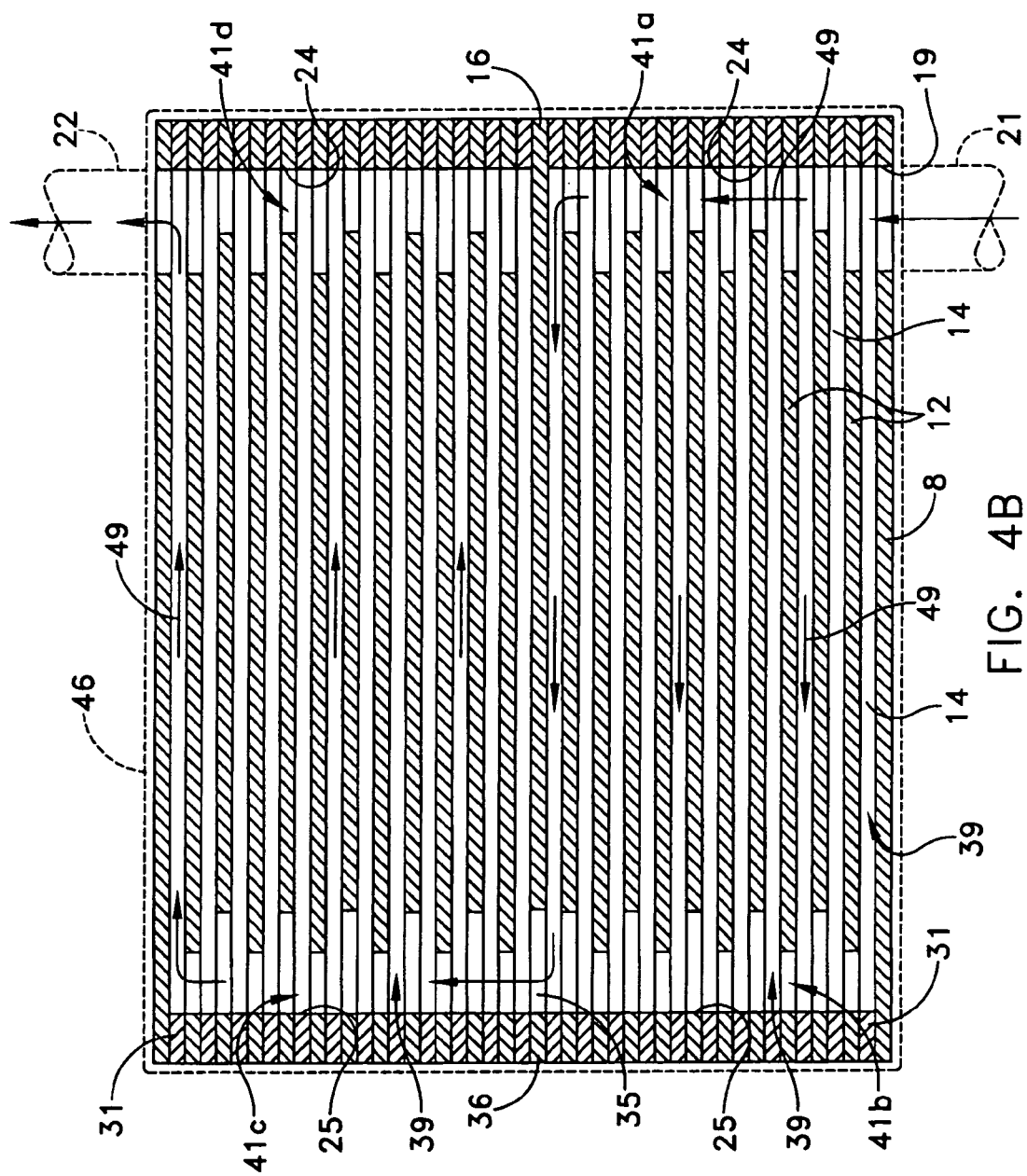
FIG. 4B is a cross-sectional top view, similar to that shown in FIG. 4A, illustrating an alternative arrangement of spacer-plates in accordance with the invention.
Figure 5:
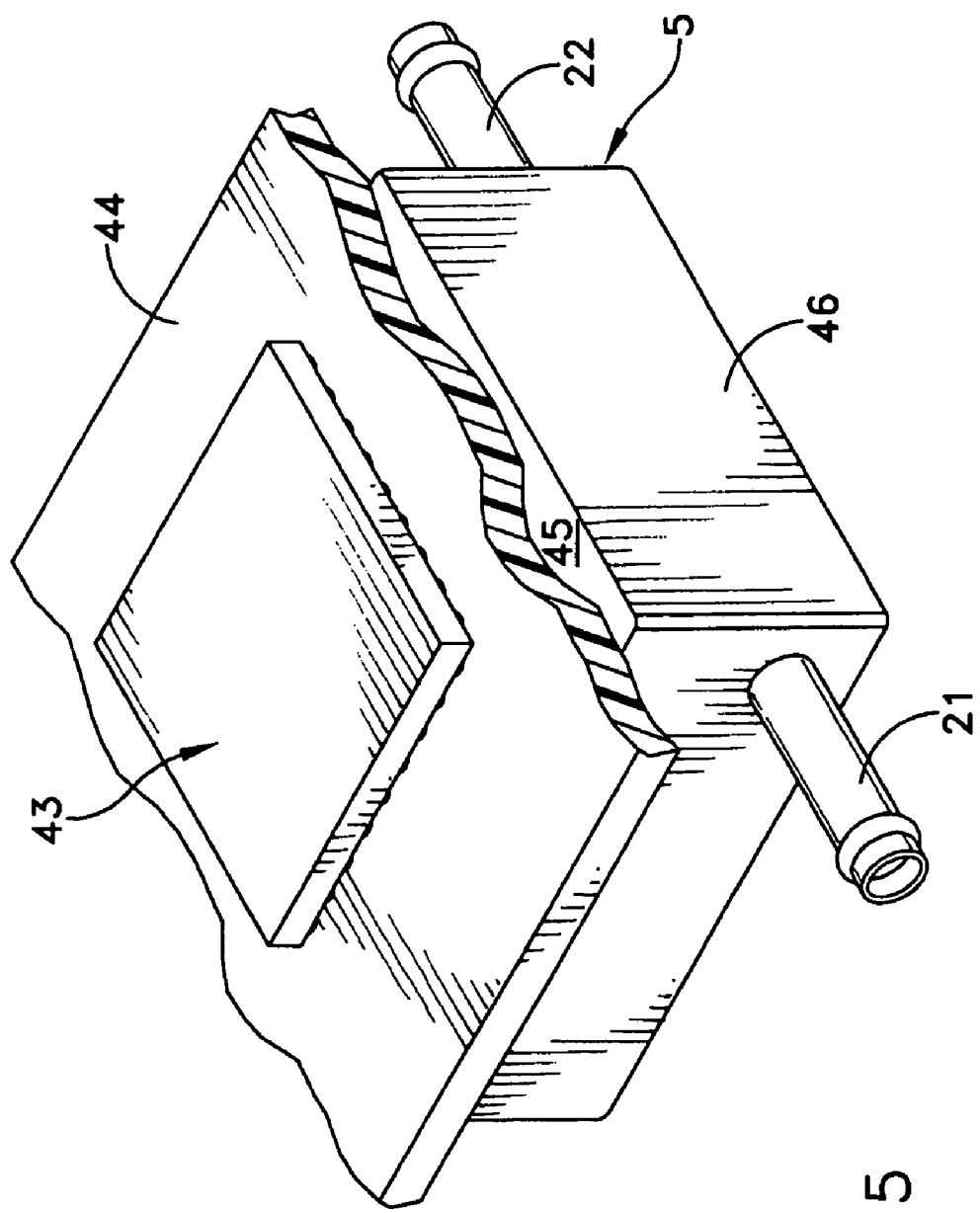
FIG. 5 is a partially broken-away, perspective view of a forced fluid heat sink with a heat spreader and semiconductor device thermally engaged to a top surface.

It will be understood that as a consequence of broad central opening 28, no portion of channel-plate 14 appreciably obstructs the void spaces that are defined within heat sink 5 by the coaxial relationship of through-bores 24 and 25 (FIGS. 3 and 4). It will also be understood that varying the aperture size of through-bores 24 and 25, along the length of, e.g., chambers 41a–d in FIGS. 4A and 4B, will provide an increased level of turbulence and eddy formation in the coolant fluid as it traverses the interior of the stack. For ease of manufacture and assembly, an alternative way to create varying size and shape chambers is to simply reverse the orientation of every other spacer-plate such that a through-bore 24 is followed by a through-bore 25, as shown in FIG. 4B. Such turbulence is well known to increase the rate and efficiency of heat transfer. Additionally, plurality of parallel passageways 39 (FIGS. 4, 4A, 4B, and 8) are defined between each pair of spacer-plates 12 by longitudinally extending beams 30 and transversely extending beams 31 of each channel-plate 14. As a consequence of the alignment of through-bores 24, 25 at the ends of spacer-plates 12, and the inclusion of only one baffle-plate 16, four or more enclosed chambers 41a, 41b, 41c, and 41d (and 41e in FIG. 8) are defined within heat sink 5. The presence of one or more baffle-plates 16 within the stack acts selectively to subdivide these void spaces or chambers 41a–d. Baffle-plates 16 may be located substantially centrally within the stack of spacer-plates 12 and channel-plates 14, and oriented such that through-bore 35 is disposed between chambers 41b and 41c (FIG. 3). The introduction of two or more baffle-plates 16 (FIGS. 7 and 8) will act to further subdivide the void spaces that are defined within heat sink 5 by the coaxial relationship of through-bores 24 and 25 into chambers 41a–e so as to provide for an even more circuitous fluid flow path through heat sink 5 (FIG. 8). As used herein, "circuitous" means a serpentine or oscillating path often characterized by one or more 180° changes in direction of flow along the flow path through the stack of plates. Of course, a plurality of baffle-plates 16 may be used in a given heat sink 5 to create a variety of circuitous coolant flow paths. In this structure, baffle-plates 16 are arranged within the stack such that their lateral edges 36(a–c) are both laterally and longitudinally spaced-away from each other so as to form a serpentine fluid path through the stack (FIGS. 7 and 8).

Figure 6:
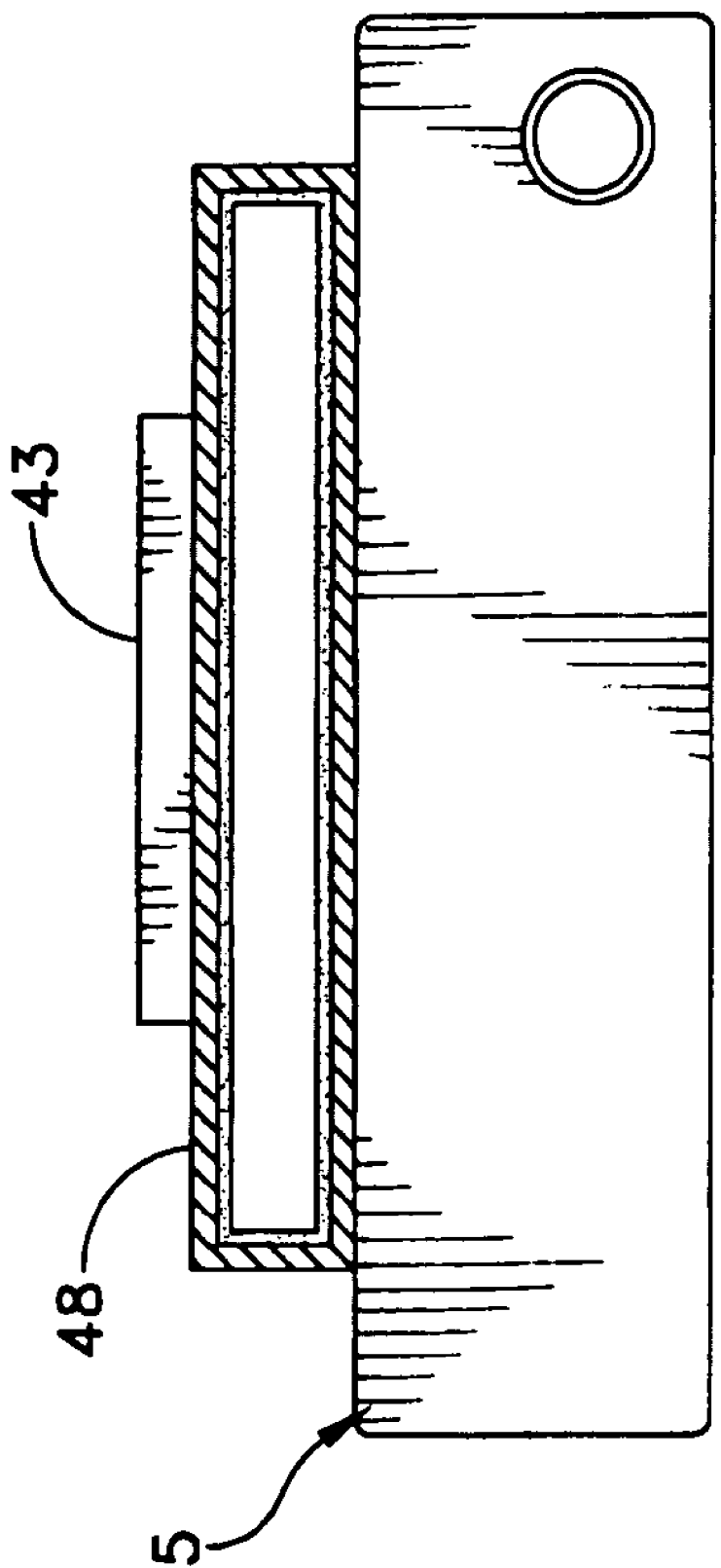
FIG. 6 is an elevational, partially cross-sectional view of a forced fluid heat sink with heat pipe-type heat spreader and semiconductor device thermally engaged to a top surface.

In operation, one or more semi-conductor devices 43 (FIGS. 5 and 6) are positioned in thermal transfer communication with a portion of heat sink 5, either directly, or with an intermediate substrate, e.g., a printed circuit board, heat pipe, or cold plate 44. Often, device 43 is placed on a top surface 45 that is defined by the laminated stack of spacer-plates 12, channel-plates 14, and baffle-plates 16, or a housing 46 that encloses the stack. A conventional heat pipe heat spreader 48 may also be disposed in thermal transfer engagement between semi-conductor device 43 and top surface 45 as needed for a particular application (FIG. 6).

When only one baffle-plate 16 has been incorporated into the stacked and laminated structure, a coolant fluid, e.g., water or a water/glycol mixture (ethylene or propylene) is pumped through a first nozzle port 21 at approximately 0.35–7.5 liters per minute (0.10–2 gallons per minute). Of course, other coolant fluids, such as flourinerts and the like, may also be used with adequate results. The coolant fluid enters heat sink 5 and fills chamber 41a (FIG. 4). It will be understood that a portion of baffle-plate 16, that is spaced-away from single through-bore 35 and lateral edge 36, blocks the coolant fluid from directly entering chamber 41d from chamber 41a. As pressure builds within chamber 41a, the coolant fluid flows transversely through the stack, via a first plurality of passageways 39 (fluid flow is generally shown as flow arrows 49 within FIGS. 4, 4A, 4B, and 8) and fills chamber 41b, coolant fluid passes through through-bore 35 of baffle-plate 16 and fills chamber 41c. As fluid pressure builds within chamber 41c, coolant fluid traverses a second plurality of passageways 39 so as to fill chamber 41d. The coolant fluid exits heat sink 5 through a second nozzle port 22.

Figure 7:
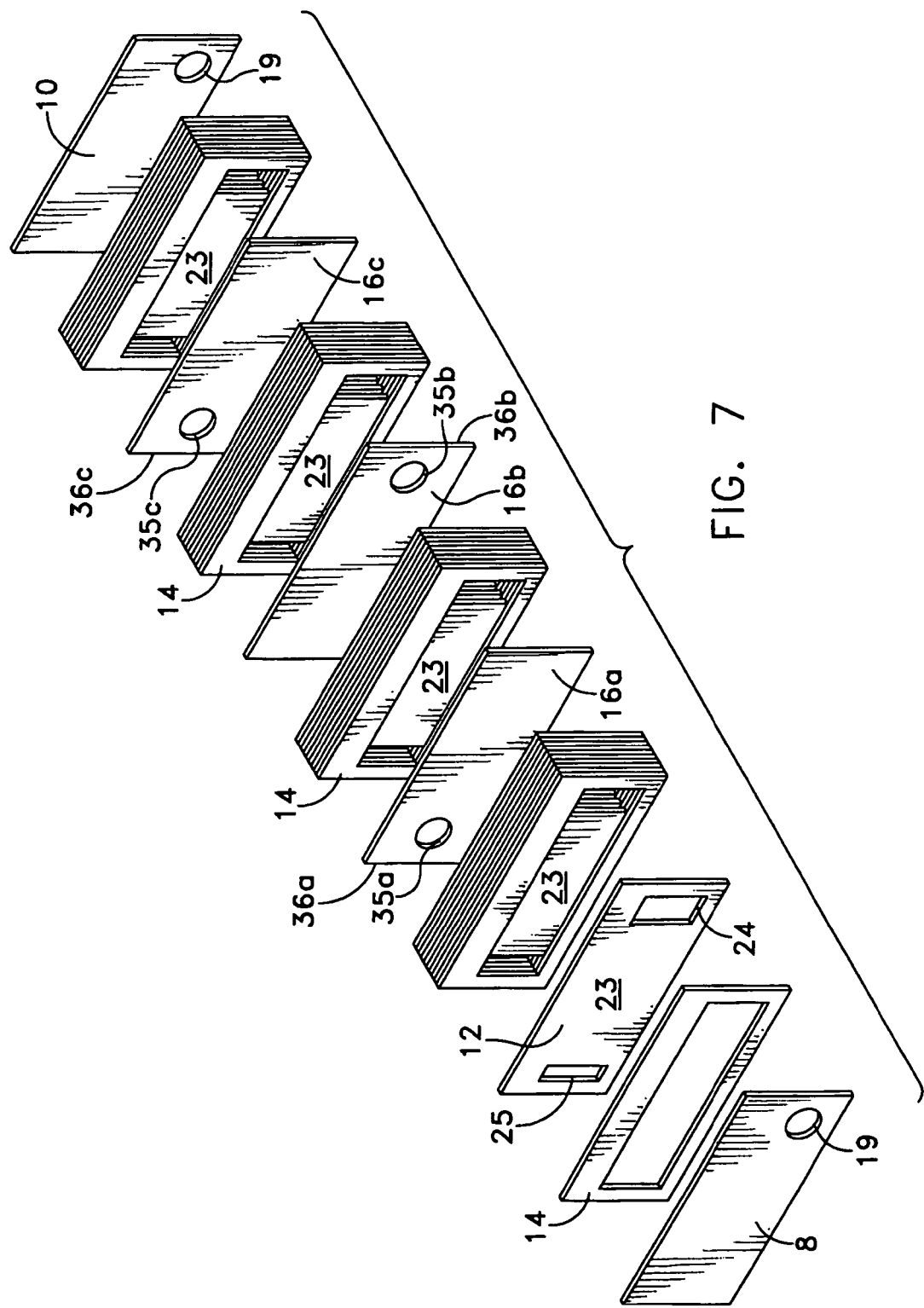
FIG. 7 is an exploded, perspective view of an alternative embodiment of force fluid heat sink, showing a plurality of baffle plates inserted between selected pairs of channel-plates so as to provide for a more circuitous fluid path through the heat sink.
Figure 8:
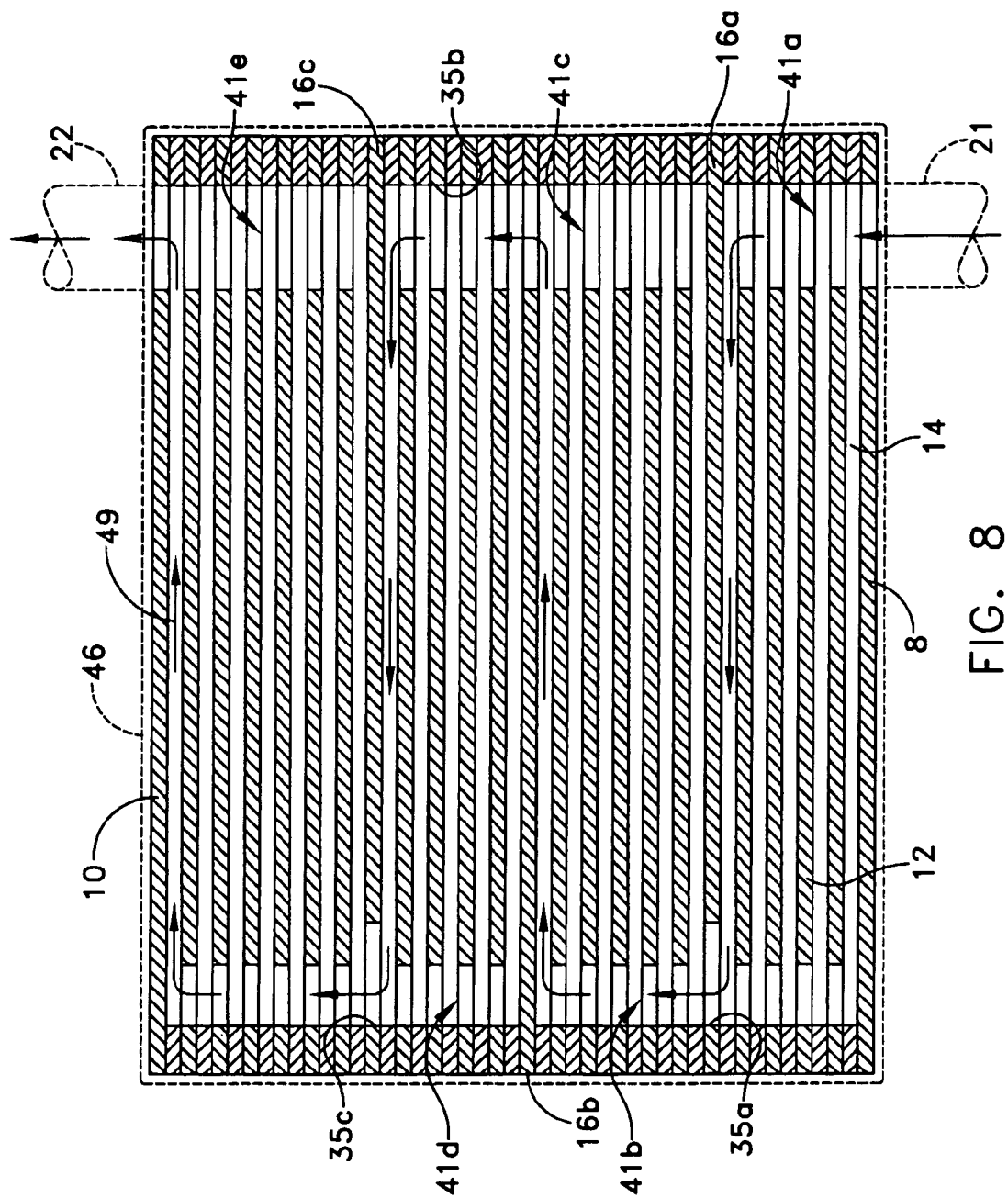
FIG. 8 is a cross-sectional top view, substantially similar in perspective to FIGS. 4, 4A and 4B, showing a forced fluid heat sink formed from the arrangement of plates shown in FIG. 7, but illustrating yet another possible circuitous fluid path through the heat sink.

If a more serpentine, multiple pass heat sink 5 is to be produced, i.e., where coolant fluid follows a more circuitous path than just described, all that is needed to be done is to introduce additional baffle-plates 16a–c so as to further subdivide the stack into, e.g., chambers 41a–e, as shown in FIGS. 7 and 8. In this embodiment, it will be understood that the position of through-bores 35a–c within heat sink 5 will alternate, from side to side, such that the chamber boundaries created by each baffle-plate 16(a–c) are spaced-away from their respective lateral edges 36(a–c). This structural arrangement further defines flow path 49 as a more circuitous path through heat sink 5.

Figure 9:
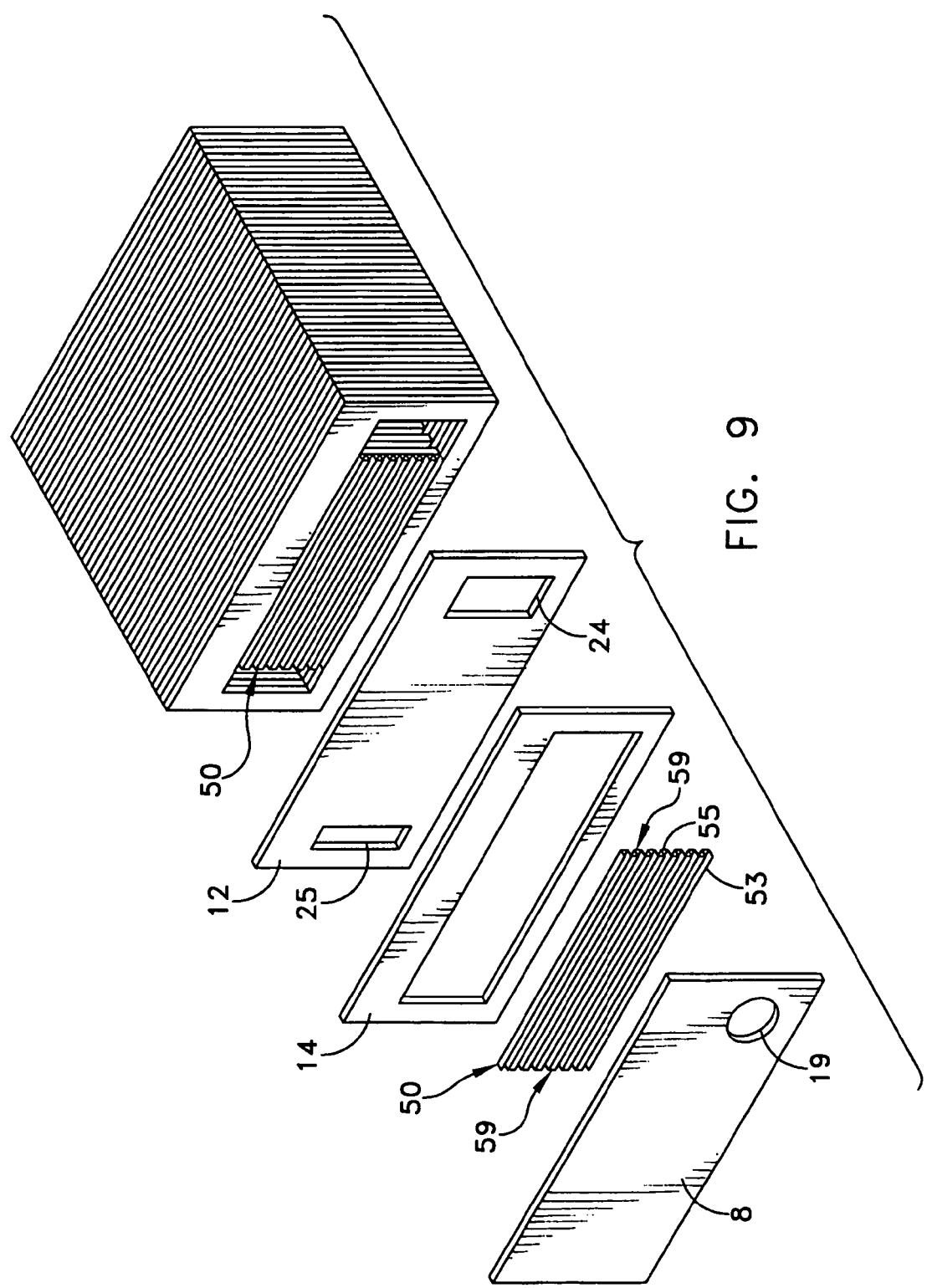
FIG. 9 is a partially exploded, perspective view of a further alternative embodiment of forced fluid heat sink formed in accordance with the present invention, incorporating one or more fin cores.
Figure 10:
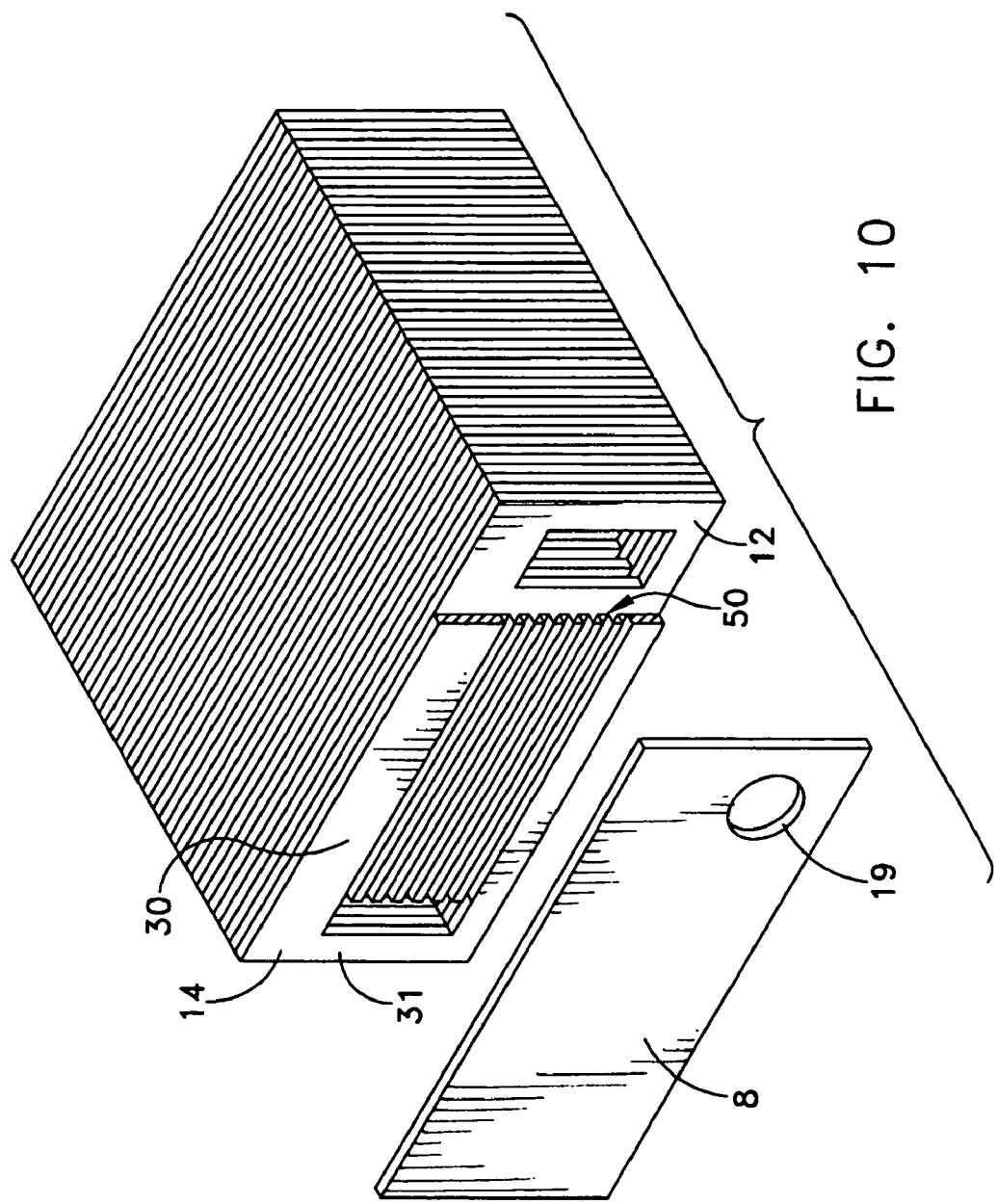
FIG. 10 is a partially exploded, partially broken-away perspective view of a forced fluid heat sink including a plurality of fin cores, as shown in FIG. 9.
Figure 13:
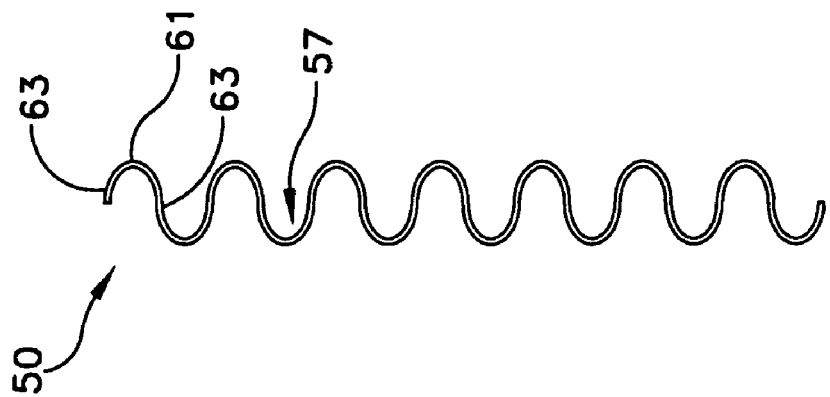
FIGS. 11–13 comprise end-on views of a variety of folded fin cores that may be used in connection with alternative embodiments of the present invention.
Figure 12:
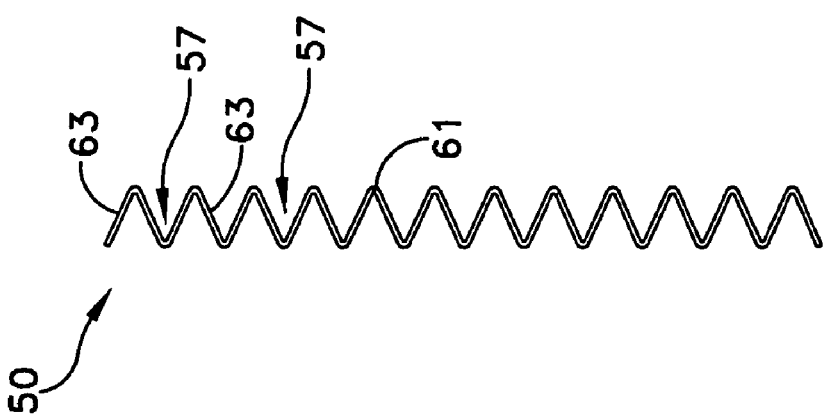
Figure 11:
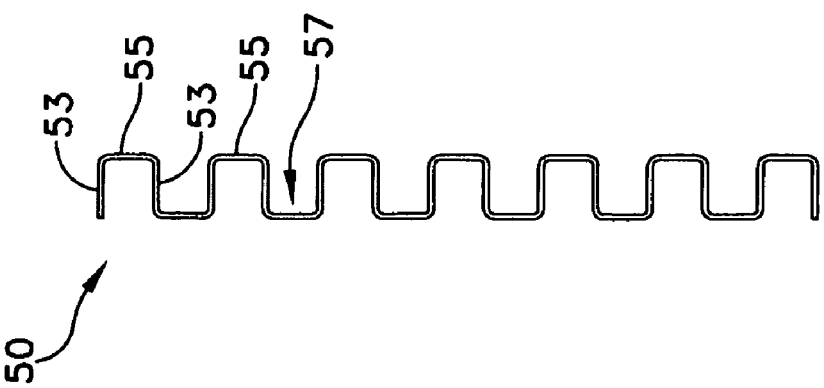

In one alternative embodiment, additional thermal conduction surfaces are provided between adjacent spacer-plates 12 by introducing a fin core 50 into one or more passageways 39 (FIGS. 9 and 10). Each fin core 50 includes a plurality of substantially parallel fin walls 53 that are separated from one another by alternating flat ridges 55 and troughs 57 (FIG. 11). Each pair of fin walls 53 are spaced-apart by a flat ridge 55 so as to form each trough 57 between them. Thus, each fin core 50 comprises a continuous sheet of thermally conductive material folded into alternating flat ridges 55 and troughs 57 defining spaced fin walls 53 having peripheral end edges 59. Each flat ridge 55 provides a flat top surface that is more suitable for brazing, soldering, or welding, or otherwise thermally attaching flat ridge 55 to confronting surfaces 23. Advantageously, the introduction of fin cores 50 into passageways 39 acts to reduce the hydraulic cross-section of each passageway 39 thereby increasing the hydraulic pressure exerted by the coolant fluid against surfaces 23. This arrangement helps to increase conductive heat transfer from heat sink 5 to the flowing coolant fluid. Of course, pointed or rounded ridges 61 (FIGS. 12 and 13) may also be incorporated into fin core 50, and fin walls 63 may also have a divergent or convergent orientation, rather than being substantially parallel to one another. Also, the inclusion of lance and off-set structures in fin core 50 will help to increase the formation of eddies in the coolant fluid and enhance performance of the device. One example of such lance and off-set structures are disclosed in U.S. Pat. No. 6,546,774, which patent is hereby incorporated herein by reference.

Figure 15:
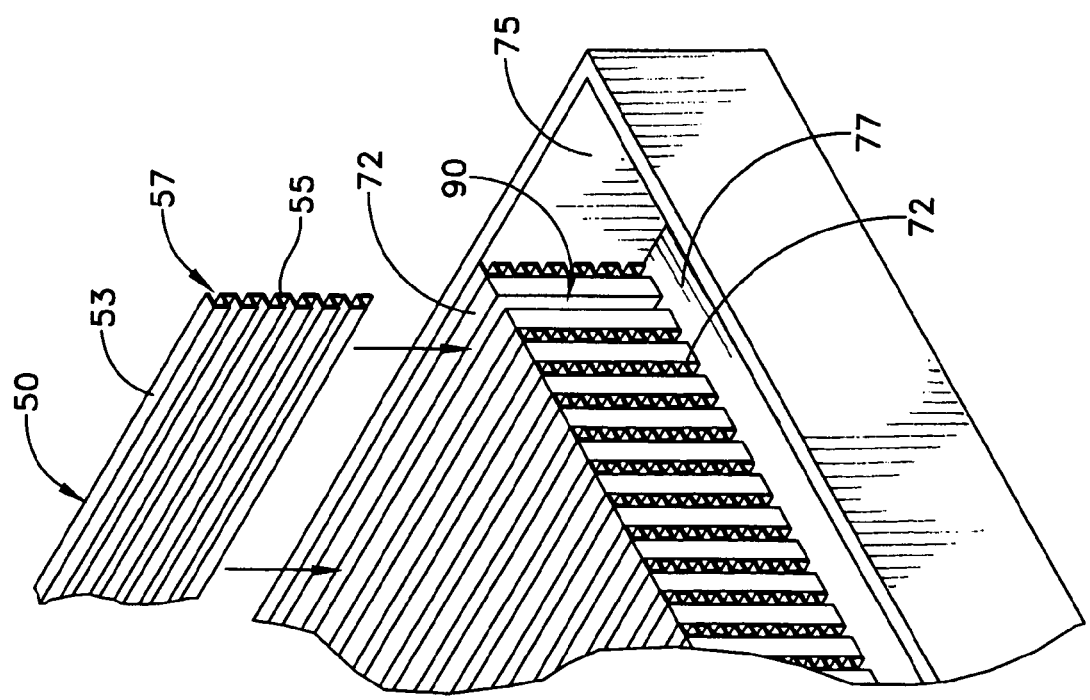
FIG. 15 is a broken-away, partially exploded portion of the forced fluid heat sink shown in FIG. 14.

Referring to FIGS. 14 and 15, an alternative embodiment of a heat sink 69 formed in accordance with the invention comprises a housing 70, a plurality of spaced-apart, parallel plates 72, and a plurality of fin cores 50. More particularly, housing 70 includes upright, peripheral wall 75, a bottom wall 77, and a lid 79. A pair of spaced apart openings 80,81 are defined through a portion of peripheral wall 75 so as to form an entrance into and exit from housing 70. Often, an entrance manifold 85 and exit manifold 86 are defined between the end edge portions of parallel plates 72 and internal portions of peripheral wall 75. Spaced-apart openings 80,81 are arranged in peripheral wall 75 so as to be in fluid communication with entrance manifold 85 and exit manifold 86. Parallel plates 72 project upwardly from bottom wall 77 in spaced-apart relation to one another so as to define a plurality of coextensive channels 90 between them. Parallel plates 72 may be milled from a portion of bottom wall 77 so as to be integral with bottom wall 77 or, they may be formed separately and later fastened by welding, brazing, or with appropriate thermal adhesives. In operation, coolant fluid enters heat sink 69 via an appropriate fixture (not shown) located within entrance opening 80, and fills entrance manifold 85. As pressure builds within entrance manifold 85, the coolant fluid flows transversely through fin cores 50 located within channels 90 and fills exit manifold 86. The coolant fluid then exits heat sink 69 via an appropriate fixture (not shown) located within exit opening 81.

Channels 90 are sized and shaped to each receive a fin core 50. Here again, the introduction of fin cores 50 into channels 90 acts to reduce the hydraulic cross-section of each channel 90 thereby increasing the hydraulic pressure exerted by the coolant fluid against parallel plates 72. This arrangement helps to increase conductive heat transfer to the flowing coolant fluid. Once again, pointed or rounded ridges 61 (FIGS. 12 and 13) may also be incorporated into fin core 50, and fin walls 63 may also have a divergent or convergent orientation, rather than being substantially parallel to one another.

Figure 16:
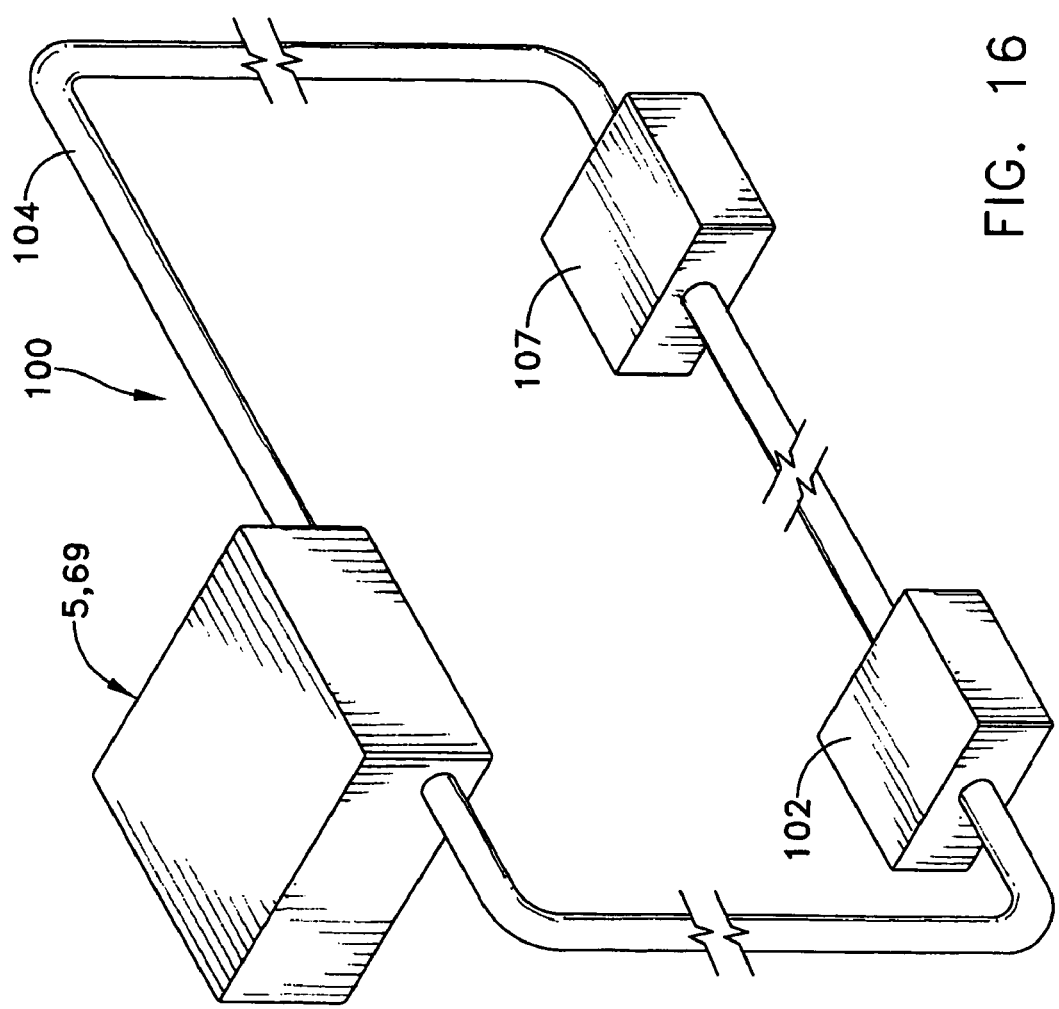
FIG. 16 is a perspective view of a forced fluid heat sink formed in accordance with yet another embodiment of the present invention forming a portion of a pumped heat transfer system.

Referring to FIG. 16, heat sinks 5 and 69 may also form an evaporator portion of a single or dual phase pumped thermal management system 100. Such systems often include one or more pumps 102 arranged along fluid conduits 104, and a condenser 107 in a closed loop system. Heat sinks 5 and 69 form a phase change region of the system.

It is to be understood that the present invention is by no means limited only to the particular constructions herein disclosed and shown in the drawings, but also comprises any modifications or equivalents within the scope of the claims.

What is claimed is:

1. A heat exchanger for cooling a heat generating device comprising:

a housing including a lid, a peripheral wall formed of a discrete member separate from said lid, and a bottom wall formed of a discrete member separate from said lid, arranged so as to define an enclosure, wherein a pair of spaced apart openings are defined through a portion of said peripheral wall so that a first of said openings forms an entrance to a first manifold and a second of said openings forms an exit from a second manifold;

a plurality of spaced-apart, discrete parallel plates that are positioned upon said bottom wall and in spaced relation to said peripheral wall, with a space defined between adjacent ones of said plates, wherein said plates are arranged so as to be in parallel relation to said portion of said peripheral wall defining said openings such that said entrance to said first manifold and said exit from said second manifold are located in the portion of said peripheral wall that extends parallel to said spaced-apart plates, and in transverse relation to said first and said second manifolds so that each space defined between said adjacent ones of said plates is in fluid communication with said first and second manifolds; and a fin core positioned within each space defined between said adjacent ones of said plates so as to reduce the hydraulic cross-section of each said space such that when a coolant enters said housing through said first opening so as to fill said first manifold, a pressure builds within said first manifold causing said coolant to flow transversely past each of said fin cores and thereby to fill said second manifold.

2. A heat exchanger according to claim 1 wherein said plurality of spaced-apart, parallel plates project outwardly from said bottom wall.

3. A heat exchanger according to claim 2 wherein said first manifold and said second manifold are defined between end edge portions of said parallel plates and internal portions of said peripheral wall.

4. A pumped thermal management system comprising:
an evaporator including a housing including a lid, a peripheral wall formed of a discrete member separate from said lid, and a bottom wall formed of a discrete member separate from said lid, arranged so as to define an enclosure, wherein a pair of spaced apart openings are defined through a portion of said peripheral wall so that a first of said openings forms an entrance to a first manifold and a second of said openings forms an exit from a second manifold and including a plurality of spaced-apart discrete, parallel plates positioned within said housing in transverse relation to said first and second manifolds such that said entrance to said first manifold and said exit from said second manifold are located in the portion of said peripheral wall that extends parallel to said spaced-apart plates, wherein each adjacent pair of said spaced-apart plates has a fin core positioned therebetween so as to reduce the hydraulic cross-section of each of said spaces such that when a coolant enters said housing through said first opening so as to fill said first manifold, a pressure builds within said first manifold causing said coolant to flow transversely past each of said fin cores and thereby to fill said second manifold;

at least one condenser; and at least one pump arranged along a fluid conduit that communicates between said evaporator and said condenser.

* * * * *